(12) United States Patent
Ahladas et al.

(10) Patent No.: US 9,941,041 B2
(45) Date of Patent: Apr. 10, 2018

(54) ELECTROMECHANICAL ASSEMBLY CONTROLLED BY SENSED VOLTAGE

(71) Applicant: INTERNATIONAL BUSINESS MACHINES CORPORATION, Armonk, NY (US)

(72) Inventors: Steven J. Ahladas, Highland, NY (US); Robert K. Mullady, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 239 days.

(21) Appl. No.: 14/846,903

(22) Filed: Sep. 7, 2015

(65) Prior Publication Data
US 2016/0301335 A1 Oct. 13, 2016

Related U.S. Application Data

(63) Continuation of application No. 14/681,184, filed on Apr. 8, 2015.

(51) Int. Cl.
*H01F 7/16* (2006.01)
*H05K 7/20* (2006.01)

(52) U.S. Cl.
CPC ........... *H01F 7/16* (2013.01); *H05K 7/20727* (2013.01)

(58) Field of Classification Search
CPC .... H01F 1/16; H05K 7/20; H05K 7/14; F16P 3/08; H02P 6/14; H02P 6/001
(Continued)

(56) References Cited

U.S. PATENT DOCUMENTS 3,092,844 A 6/1963 Brunson
3,936,701 A * 2/1976 Wilson .................... H02H 3/24
361/92

(Continued)

FOREIGN PATENT DOCUMENTS

CN 2907195 Y 5/2007
CN 202902522 U 4/2013
(Continued)

OTHER PUBLICATIONS

Walker Rider Lawnmowers: Owner's Manual, http://www.walkermowers.com/manuals/mowers/model-ms-manuals/5000-16_pub.pdf, Jan. 15, 2005 (72 pages).
(Continued)

*Primary Examiner* — Dinh T Le
(74) *Attorney, Agent, or Firm* — Teddi Maranzano; Kevin P. Radigan, Esq.; Heslin, Rothenberg, Farley & Mesiti, P.C.

(57) ABSTRACT

An electromechanical assembly is provided controlled by voltage across a motor or with an electronic system. The electromechanical assembly includes a control circuit coupled to sense voltage at the motor or within the electronic system, and an electromechanical actuator energized by the voltage sensed by the control circuit. A movable element is movable by the electromechanical actuator from an operational position to a quiesced position when the voltage sensed by the control circuit falls below a quiesced threshold. In certain embodiments, the voltage being sensed is across a motor of an air-moving assembly, which resides within a support structure, or the voltage being sensed is within the electronic system, which resides within the support structure, and the movable element is an interlock element which interlocks to the support structure to prevent
(Continued)

removal of one or more components from the structure when sensed voltage is above the quiesced threshold.

10 Claims, 14 Drawing Sheets

(58) Field of Classification Search
USPC .......................................................... 307/328
See application file for complete search history.

(56) References Cited

U.S. PATENT DOCUMENTS

| | | |
|---|---|---|
| 3,977,135 A | 8/1976 | Huntley, Jr. |
| 4,022,548 A | 5/1977 | McLarty |
| 4,657,485 A | 4/1987 | Hartwig |
| 5,285,751 A | 2/1994 | Liegeois et al. |
| 5,451,188 A | 9/1995 | Kraft et al. |
| 5,562,410 A | 10/1996 | Sach et al. |
| 6,075,698 A | 6/2000 | Hogan et al. |
| 6,115,250 A | 9/2000 | Schmitt |
| 6,351,199 B1 | 2/2002 | Perini |
| 6,663,461 B2 | 12/2003 | Fong |
| 6,711,013 B2 | 3/2004 | Wobig et al. |
| 6,714,411 B2 | 3/2004 | Thompson et al. |
| 6,817,889 B2 | 11/2004 | Chang et al. |
| 6,837,674 B2 | 1/2005 | Phillips, III |
| 6,947,281 B2 | 9/2005 | Wycraft et al. |
| 7,033,206 B2 | 4/2006 | Chang et al. |
| 7,357,708 B2 | 4/2008 | Lee |
| 7,688,593 B2 | 3/2010 | Byers et al. |
| 7,706,950 B2 | 4/2010 | Hino et al. |
| 8,056,990 B2 | 11/2011 | Ye |
| 8,320,121 B2 | 11/2012 | Bisson et al. |
| 8,368,329 B1 | 2/2013 | Depew et al. |
| 8,425,286 B2 | 4/2013 | Coster et al. |
| 8,707,924 B2 * | 4/2014 | Moriya ................ F02D 41/009 123/179.25 |
| 2002/0141879 A1 | 10/2002 | Casey et al. |
| 2003/0161103 A1 | 8/2003 | Wycraft et al. |
| 2005/0186091 A1 | 8/2005 | Zarbi et al. |
| 2007/0004577 A1 | 1/2007 | Lederer |
| 2007/0041864 A1 | 2/2007 | Forsyth et al. |
| 2013/0167871 A1 | 7/2013 | Jones |
| 2013/0276751 A1 | 10/2013 | Raasch |
| 2013/0323044 A1 | 12/2013 | Sun |
| 2015/0279539 A1 | 10/2015 | Blanding et al. |
| 2016/0125993 A1 * | 5/2016 | Narayanasamy ..... H01F 7/1844 361/160 |
| 2016/0292959 A1 | 10/2016 | Salzman et al. |

FOREIGN PATENT DOCUMENTS

| | | |
|---|---|---|
| CN | 203098342 U | 7/2013 |
| DE | 10124135 A1 | 11/2001 |
| GB | 1295000 A | 4/1970 |
| GB | 1 377 387 | 12/1974 |
| JP | 10126079 A | 5/1998 |
| JP | 2002-164681 A | 6/2002 |
| JP | 2006-344661 A | 12/2006 |
| JP | 2008-17099 A | 7/2008 |
| WO | WO/2000000871 A1 | 1/2000 |

OTHER PUBLICATIONS

Lenci et al., "Design, Construction, System Integration, and Test Results of the MW CW FR System for the e-Gun Cavity in the Energy Recovery LINAC at Brookhaven National Laboratory", BNL-82365-2009 (2009) (5 pages).

Campbell et al., "Locking Louver Assembly for Air-Moving Assembly", U.S. Appl. No. 14/499,387, filed Sep. 29, 2014 (35 pages).

Campbell et al., "Protective Louver Assembly for Air-Moving Assembly", U.S. Appl. No. 14/499,402, filed Sep. 29, 2014 (34 pages).

Campbell et al., "Interlock Assembly for Air-Moving Assembly", U.S. Appl. No. 14/499,422, filed Sep. 29, 2014 (36 pages).

Campbell et al., "Protective Cover Assembly for Air-Moving Assembly", U.S. Appl. No. 14/565,740, filed Dec. 10, 2014 (35 pages).

Ahladas et al., "Electromechanical Assembly Controlled by Sensed Voltage", U.S. Appl. No. 14/681,184, filed Apr. 8, 2015 (43 pages).

Ahladas et al., "List of IBM Patents or Patent Applications Treated As Related" for U.S. Appl. No. 14/846,903, dated Sep. 7, 2015 (2 pages).

Ahladas et al., Non-Final Office Action for U.S. Appl. No. 14/681,184, filed Apr. 8, 2015 (U.S. Patent Publication No. 2016/0300654 A1), dated Oct. 18, 2017 (12 pages).

* cited by examiner

ELECTROMECHANICAL ASSEMBLY CONTROLLED BY SENSED VOLTAGE

BACKGROUND

In many server applications, processors along with their associated electronics (e.g., memory, disk drives, power supplies, etc.) are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack, including the electronic subsystems thereof. As one solution, a cooling apparatus may be provided which includes one or more air-moving assemblies (e.g., axial fans or centrifugal fans) which facilitate moving an airflow through the electronics rack, usually front-to-back.

In certain implementations, multiple air-moving assemblies may be provided in association with one or more drawers or electronic systems (or subsystems) in order that the assemblies may be concurrently maintainable, such that if one fails, the failure does not stop airflow through the electronic system, and thus negatively affect operational availability of computing resources to the customer. In the event that a non-quiesced air-moving assembly is mistakenly removed, the fan or impeller wheel may still be rotating at a high speed, for instance, at 4000 RPMs or above, and have significant momentum, due to the mass of the fan or impeller. This action could potentially result in injury to the operator removing the air-moving assembly.

BRIEF SUMMARY

In one aspect, the shortcomings of the prior art are overcome and additional advantages are provided herein through the provision of a method which includes providing an electromechanical assembly to couple to a system comprising at least one of a motor or an electronic system to monitor voltage at the motor or within the electronic system. The providing of the electromechanical assembly includes: providing a control circuit to sense voltage at the motor or within the electronic system; providing an electromechanical actuator energized by the voltage sensed by the control circuit at the motor or within the electronic system; and providing a movable element associated with and movable by the electromechanical actuator, the electromechanical actuator moving the movable element from an operational position to a quiesced position when the voltage sensed by the control circuit at the motor or within the electronic system falls below a quiesced threshold.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects are particularly pointed out and distinctly claimed as examples in the claims at the conclusion of the specification. The foregoing and objects, features, and advantages of one or more aspects of the invention are apparent from the following detailed description taken in conjunction with the accompanying drawings in which:

DETAILED DESCRIPTION

Reference is made below to the drawings, where the same reference numbers used throughout different figures designate the same or similar components.

Figure 1:
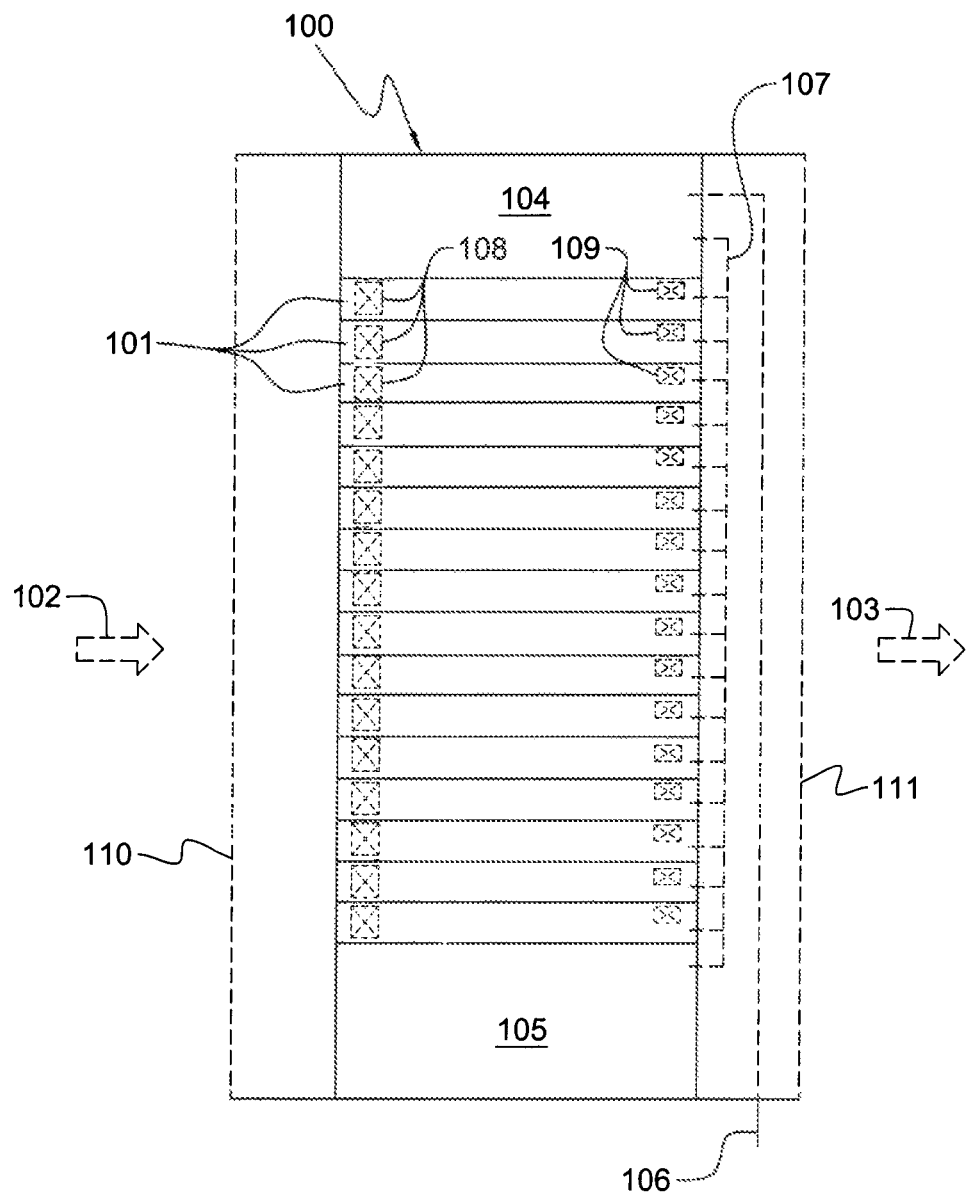
FIG. 1 is an elevational depiction of one embodiment of an electronics rack, which may include one or more apparatuses, in accordance with one or more aspects of the present invention.

FIG. 1 depicts (by way of example) one embodiment of an electronics rack 100 with a plurality of electronic subsystems or drawers 101 to be cooled. In the embodiment illustrated, electronic systems, subsystems 101 are air-cooled by cool airflow 102 ingressing via an air inlet 110, and exhausting out an air outlet 111 as hot airflow 103. One or more air-moving assemblies 108 may be provided at the air inlet sides of electronic subsystems 101 and/or one or more air-moving assemblies 109 may be provided at the air outlet sides of electronic subsystems 101 to facilitate airflow through the individual subsystems 101 as part of the cooling apparatus of electronics rack 100. By way of example, air-moving assemblies 108 at the air inlets to electronic subsystems 101 may be or include axial fan assemblies, and air-moving assemblies 109 disposed at the air outlets of electronic subsystems 101 may be or include centrifugal fan assemblies. One or more of electronic subsystems 101 may include heat-generating components to be cooled of a computer system, electronics system, or information technology (IT) equipment. For instance, one or more of the electronic subsystems 101 may include one or more processors and associated memory.

Electronics rack 100 may also include, by way of example only, one or more bulk power assemblies 104 of an AC to DC power supply assembly. AC to DC power supply assembly further includes, in one embodiment, a frame controller, which may be resident in the bulk power assembly 104 and/or in one or more electronic subsystems 101. Also illustrated in FIG. 1 is one or more input/output (I/O) drawer(s) 105, which may also include a switch network. I/O drawer(s) 105 may include, as one example, PCI slots and disk drivers for the electronics rack.

In implementation, a three-phase AC source may feed power via an AC power supply line cord 106 to bulk power assembly 104, which transforms the supplied AC power to an appropriate DC power level for output via distribution cable 107 to the plurality of electronic subsystems 101 and I/O drawer(s) 105. The number of electronic subsystems installed in the electronics rack is variable, and depends on customer requirements for a particular system. Further, although described with reference to multiple electronic subsystems 101, the air-moving assemblies discussed herein could reside within, for instance, bulk power assembly 104, or I/O drawer(s) 105. Again, the particular electronics rack configuration of FIG. 1 is presented by way of example only, and not by way of limitation.

Figure 2:
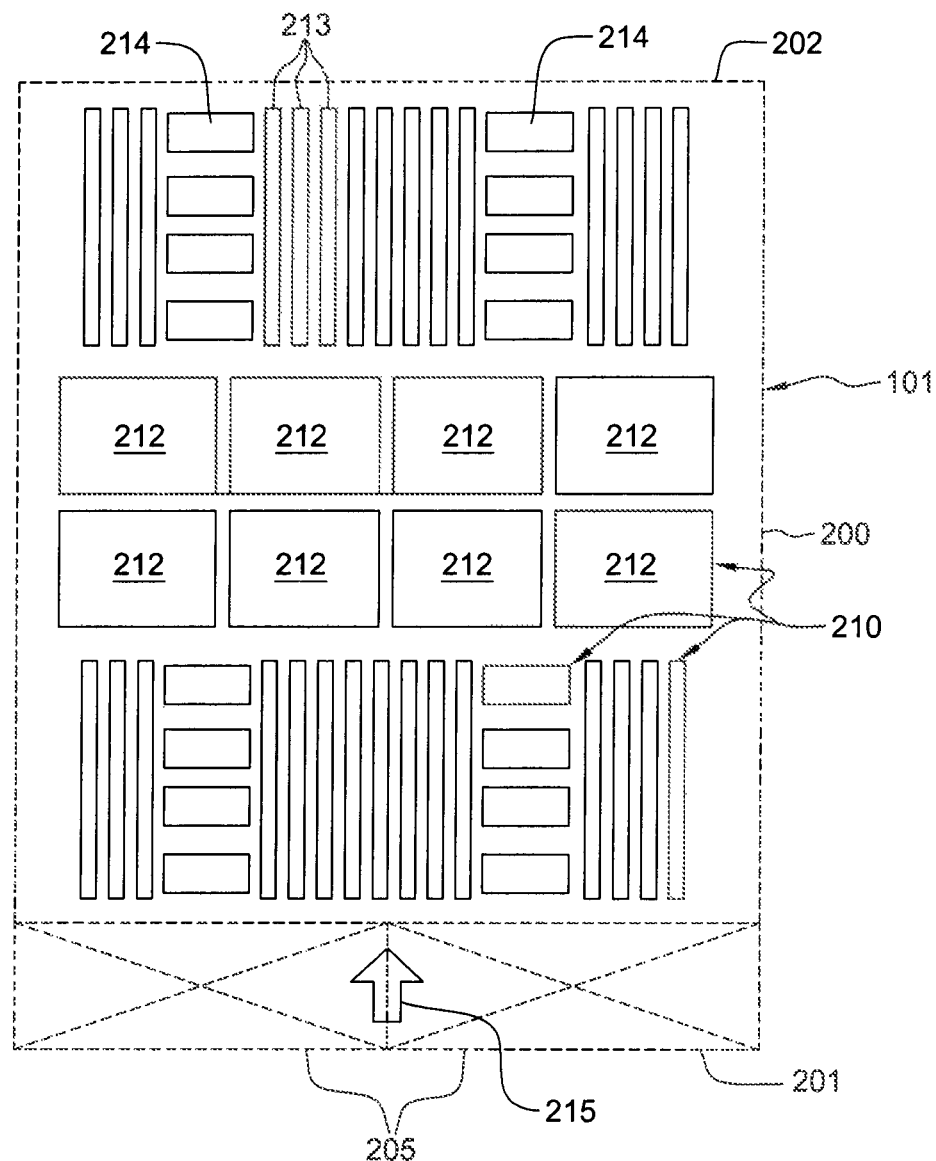
FIG. 2 is a plan view of one embodiment of an electronics drawer layout illustrating multiple air-moving assemblies at an air inlet side of the layout, and which may include one or more apparatuses, in accordance with one or more aspects of the present invention.

FIG. 2 depicts one embodiment of an electronic subsystem 101 layout which includes a chassis 200 being air-cooled utilizing one air-cooling approach, where one or more air-moving assemblies 205 provide forced airflow 215 in operational state to cool multiple electronic components 210 within electronic subsystem 101. Cool air is taken in through an air inlet 201 and heated air is exhausted out an air outlet 202 of the electronic subsystem. The multiple components 210 to be cooled may include, by way of example, multiple processor modules 212, as well as multiple arrays of memory modules 213 (e.g., dual-in-line memory modules (DIMMs)) and multiple rows of memory support modules 214 (e.g., DIMM control modules). In one implementation, air-cooled heat sinks (not shown) may be coupled to one or more of processor modules 212, memory modules 213, and/or memory support modules 214 to facilitate dissipation of heat therefrom.

In the depicted example of FIG. 2, the air-moving assemblies 205, as well as the electronic components, reside within chassis 200 containing or supporting the electronic subsystem. Also, as depicted, the air-moving assemblies 205 disposed at the air inlet side 201 of the electronic subsystem may be redundant fan assemblies, which concurrently provide the cooling airflow 215 across or through the electronic components of the electronic subsystem.

Figure 3A:
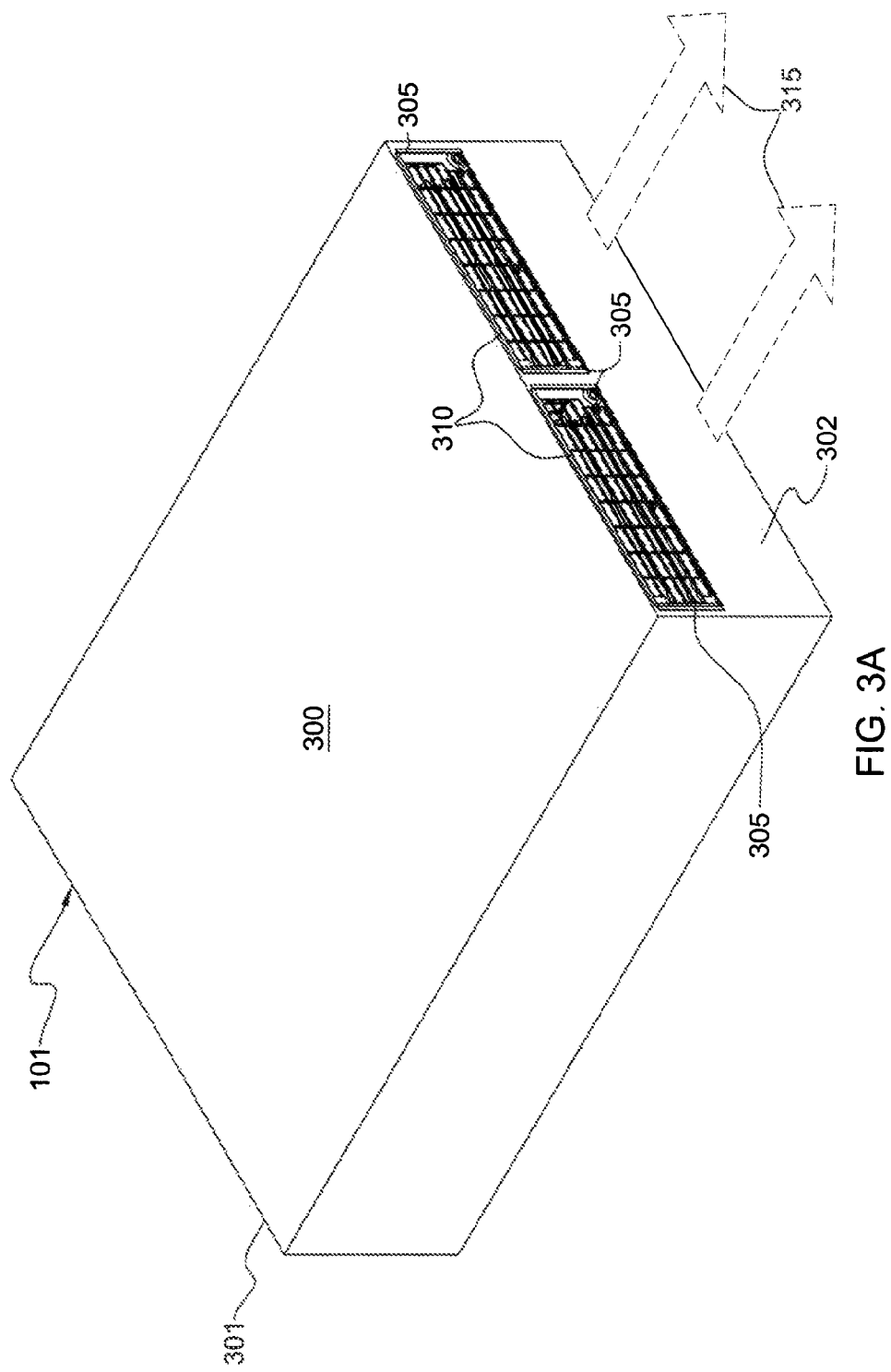
FIG. 3A depicts another embodiment of an electronics drawer or chassis with multiple air-moving assemblies disposed at an air outlet side of the chassis, and which may include one or more apparatuses, in accordance with one or more aspects of the present invention.

FIG. 3A partially depicts an alternate embodiment of an electronic subsystem 101 layout which includes a chassis 300, and redundant air-moving assemblies 310 disposed at an air outlet side 302 of the electronic subsystem, with the air inlet side 301 being, by way of example, at an opposite side of chassis 300. Redundant air-moving assemblies 310 are operatively positioned within chassis 300 within, for instance, respective receiving tracks 305, which are a part of or affixed to chassis 300. In FIG. 3A, air-moving assemblies 310 are shown operational, with an airflow 315 exiting the air outlets thereof.

Figure 3B:
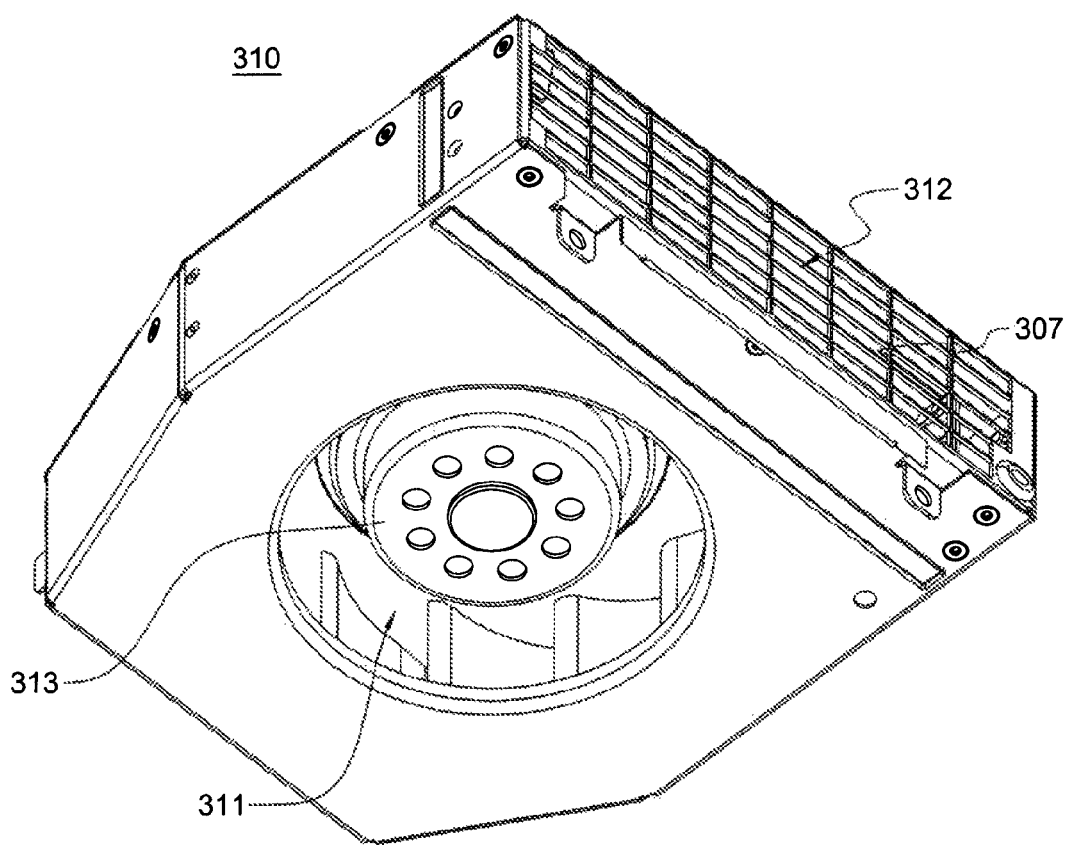
FIG. 3B depicts one embodiment of an air-moving assembly of FIG. 3A, shown removed from the chassis, and which may be part of or monitored by an apparatus, in accordance with one or more aspects of the present invention.

FIG. 3B depicts one embodiment of air-moving assembly 310 of FIG. 3A. In this embodiment, air-moving assembly 310 is depicted as a centrifugal fan assembly with a relatively large air inlet opening 311 in a lower surface thereof, exposing the centrifugal blower 313, and an air outlet 312, which may have a grating 307 as a safety feature. As noted above, in many systems today, air-moving assemblies may be designed to be concurrently maintainable, so that one assembly entering into a quiesced state does not significantly impact system cooling, and thus operational availability of computing resources to a customer. In the event that an operating air-moving assembly 310 is removed, the fan or impeller wheel may be spinning at a high speed, and have significant momentum due to its mass. This could result in injury to the operator removing the assembly, particularly in a centrifugal fan design such as illustrated in FIG. 3B, where there is a relatively large air inlet 311 within the assembly.

One possible solution to the issue is to provide a fixed grill with openings smaller than an operator's fingers at the air assembly's inlet. However, this could significantly impede airflow through the assembly. An alternate approach is to disallow redundancy for concurrent replaceability, which is undesirable, since a customer could experience a computing outage due to a single air-moving assembly transitioning to quiesced state, for instance, due to a failure.

As a solution, disclosed herein are apparatuses and methods which address, in part, the above-noted drawbacks to existing, currently maintainable, air-moving assemblies. The apparatuses may include, for instance, an electromechanical assembly coupled to monitor a motor, such as the motor of an air-moving assembly. The electromechanical assembly includes a control circuit coupled to sense voltage at one or more motor windings of the motor, and an electromechanical actuator energized by the voltage sensed by the control circuit at the one or more motor windings. In addition, the assembly includes a movable element movable by the electromechanical actuator. The movable element may be part of the electromechanical actuator, such as an extendible shaft or other movable member of the electromechanical actuator, and/or include a spring mechanism or one or more other structures controllable by the electromechanical actuator. The electromechanical actuator moves the moveable element from an operational position to a quiesced position when the voltage sensed by the control circuit at the one or more motor windings of the motor falls below a predefined, quiesced threshold level. As will be understood by the examples provided herein, the electromechanical actuator and movable element may be configured such that the movable element is either extended or retracted in operational position, with the quiesced position being the other of the extended or retracted position for a particular application.

As noted, in one or more implementations, the motor is part of an air-moving assembly, and subsequent to switching off or interrupting power to the air-moving assembly, voltage at the one or more motor windings remains for a period of time due to back electromotive force being generated by the air-moving assembly as the rotor slows. The air-moving assembly may reside within a support structure in operative position, such as a chassis or electronics drawer, and the movable element may be or include an interlock element or tab which interlocks to the support structure to prevent removal of one or more components from the support structure when the sensed voltage at the one or more motor windings is above the quiesced threshold. By way of example, the support structure may include the chassis within which the air-moving assembly resides in operative position, and the one or more components may include the air-moving assembly itself. In such an embodiment, the interlock element prevents removal of the air-moving assembly from the chassis when the sensed voltage at the one or more motor windings is above the quiesced threshold. In one or more other implementations, the support structure includes an electronics drawer and an electronics rack, and the interlock element is associated with the electronics drawer and interlocks with the electronics rack to prevent removal of the electronics drawer from the electronics rack when the sensed voltage at the one or more motor windings is above the quiesced threshold.

In certain embodiments, the control circuit of the electromechanical assembly includes a bridge rectifier electrically coupled to the one or more motor windings, and a comparator coupled to compare the sensed voltage to the quiesced threshold, where the quiesced threshold is predetermined as a safe threshold voltage which allows for removal of the one or more components. For instance, the electromechanical actuator locks the one or more components, such as a the air-moving assembly, in place until power to the one or more motor windings of the motor is terminated (for instance, the motor is switched off), and the sensed voltage at the motor windings is below the quiesced threshold, where the quiesced threshold is predefined to correlate to a safe motor RPMs to allow access to the one or more components.

In one or more implementations, the movable element is or includes an interlock element or tab which interlocks with a cover over at least part of an electronics drawer. The interlock element prevents opening of the cover when the sensed voltage is above the quiesced threshold. By way of example, the movable element may be or include a movable member of the electromechanical actuator, and the electromechanical actuator may further include a solenoid, which surrounds, at least in part, the movable member. In one or more embodiments, the movable element may include, at least in part, a spring mechanism coupled to the electromechanical actuator.

In certain further embodiments, the motor may be part of an air-moving assembly, and the movable element may couple to at least one louver disposed at an air inlet or an air outlet of the air-moving assembly. The movable element may be configured to facilitate pivoting of the at least one louver between an operational position and a quiesced position depending, in part, on the sensed voltage at the one or more motor windings. For instance, the movable element may be coupled to direct actuation of the louvers based on sensed voltage at the one or more motor windings of the air-moving assembly. Alternatively, the movable element may be coupled to apply a spring biasing to the one or more louvers to reduce an airflow force otherwise required to open the louvers when the mechanical element is in quiesced position (indicative of the air-moving assembly being in quiesced state), and to not load the louvers when the movable element is in operational position.

The above-described electromechanical assemblies may, in one or more further implementations, alternatively be coupled to monitor voltage within an electronic system, such as at one or more capacitors of an electronic system, to ensure energy levels within the system are safe before the electromechanical assembly allows service personnel access to the system. In such implementations, rather than monitoring voltage at a motor or a motor winding, the electromechanical assembly, and in particular the control circuit, monitors voltage at one or more locations within the electronic system, and the electromechanical actuator moves the movable element from the operational position to the quiesced position when the sensed voltage within the electronic system falls below the quiesced threshold. Thus, in one or more embodiments, the movable element of the electromechanical assembly may be configured to ensure that system energy is bled down to a safe level before allowing access to the electronic system.

Figure 4:
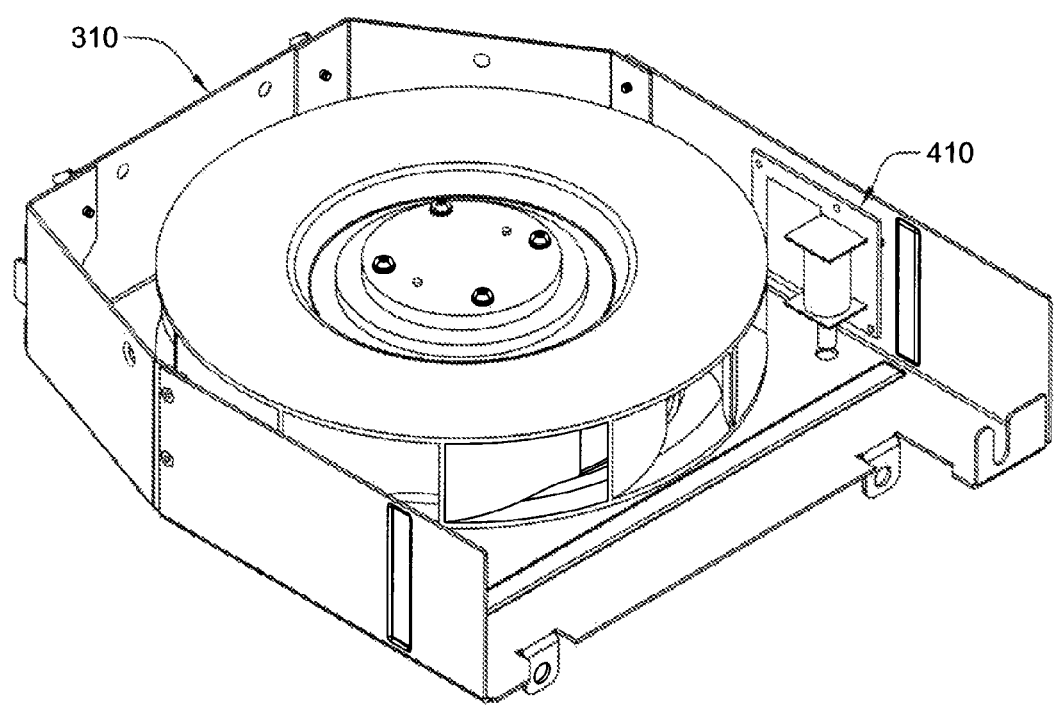
FIG. 4 depicts one partial embodiment of an apparatus comprising an air-moving assembly, such as depicted in FIG. 3B, and an associated electromechanical assembly, in accordance with one or more aspects of the present invention.

As one detailed example, FIG. 4 depicts one partial embodiment of an apparatus, generally denoted 400, in accordance with one or more aspects of the present invention. Apparatus 400 includes, by way of example only, an air-moving assembly 310, such as the air-moving assembly described above in connection with FIGS. 3A & 3B, wherein in one example, air-moving assembly 310 may be a centrifugal fan assembly. In the embodiment illustrated, an air-moving assembly 310 is shown without its cover and air outlet grating, and with an electromechanical assembly 410 being provided in association with air-moving assembly 310. In particular, electromechanical assembly 410 is illustrated mounted within the housing of air-moving assembly 310, by way of example. As will be understood from the description provided herein, this placement of electromechanical assembly 410 within the housing of the air-moving assembly 310 is presented as one detailed example only. The concepts disclosed herein are not limited to the location of the electromechanical assembly relative to the motor being monitored.

Figure 5:
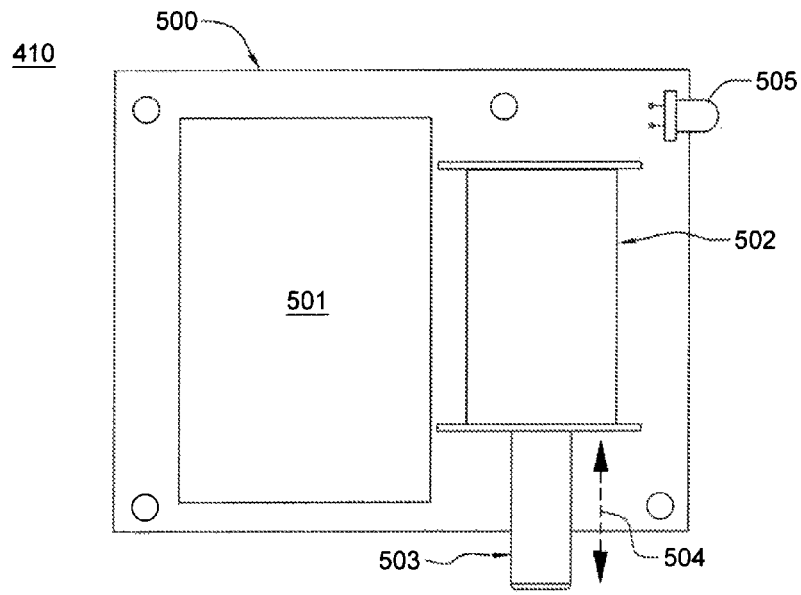
FIG. 5 depicts the electromechanical assembly of FIG. 4, in accordance with one or more aspects of the present invention.

FIG. 5 depicts in greater detail one embodiment of electromechanical assembly 410 of FIG. 4. As illustrated, electromechanical assembly 410 includes, in one or more implementations, a substrate or a card 500 supporting a control circuit 501 and an electromechanical actuator 502 which comprises or is associated with a movable element or component 503 to move the movable component 503 between an operational position, and a quiesced position. By way of example, in one embodiment, electromechanical actuator 502 is configured such that when sensing an operational voltage at the one or more motor windings of, for instance, the air-moving assembly, then the movable component 503 is extended, in the operational position in this example, and when the sensed voltage falls below the quiesced threshold, then the movable component 503 is retracted, in the quiesced position. In this context, extended and retracted may be defined in relation to, for instance, electromechanical actuator 502 or card 500. As noted, the extension of movable component 503 in operational position represents one embodiment only of the concepts disclosed herein. Movable component 503 is movable, for instance, translatable, between the operational position and the quiesced position, and thus has a defined travel 504. Note that although depicted herein as providing linear actuation, the electromechanical actuator 502 could alternatively, in one or more implementations, be implemented as a rotary-style actuator depending, for instance, on the configuration of the movable element and the use for which the electromechanical assembly is designed. A signal light 505 may also be provided, driven, for instance, by control circuit 501. In one or more embodiments, signal light 505 may be ON when the movable element is in operational position, and automatically switched OFF upon translation of the movable element to the quiesced position. In one or more implementations, signal light 505 may be or include one or more light-emitting diodes.

Figure 6:
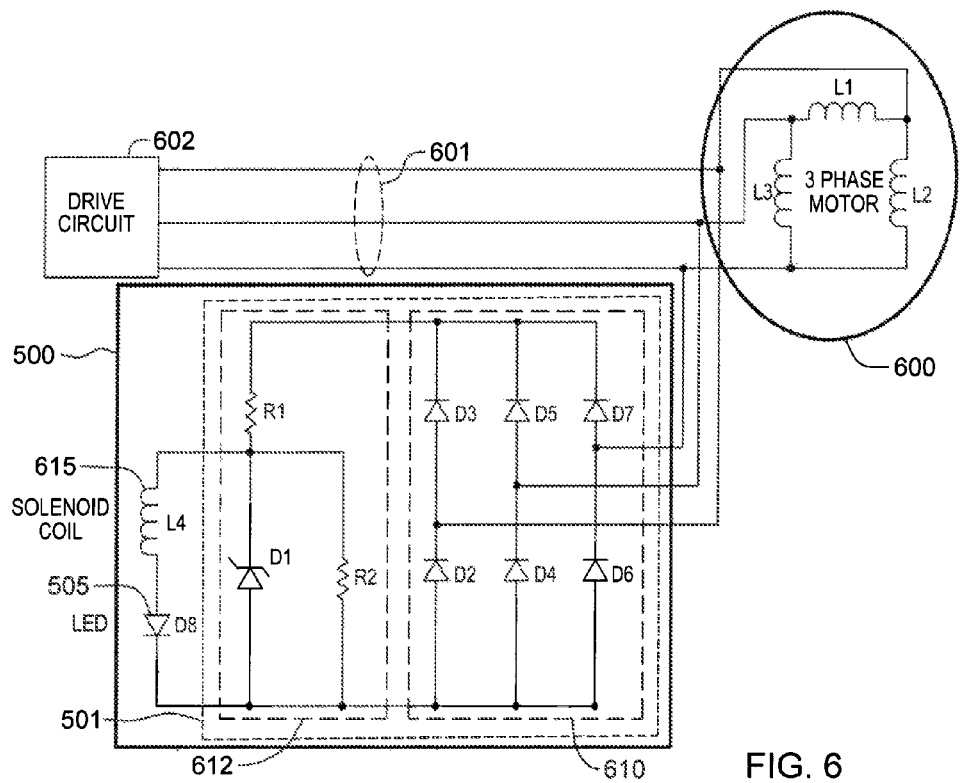
FIG. 6 is an electrical schematic of one embodiment of a control circuit of the electromechanical assembly of FIGS. 4 & 5, shown coupled to sense voltage at one or more motor windings of the air-moving assembly, in accordance with one or more aspects of the present invention.

FIG. 6 is an electrical schematic of one embodiment of certain components of the electromechanical assembly 410 of FIG. 5. In the embodiment shown, the control circuit 501 electrically couples to one or more motor windings L1, L2, L3, of a motor 600. For instance, the electromechanical assembly may be electrically coupled to one or more motor windings of an air-moving assembly, such as described above. In the example depicted, a three-phase motor 600 is illustrated, which is electrically driven by a drive circuit 602 via supply lines 601. By way of example, control circuit 501 may include a bridge rectifier 610 and a comparator 612. For instance, a three-phase rectifier may be employed to monitor the three-phase (voltage) waveform from motor 600 and provide a full wave rectification of the signals to a DC level. This resultant DC level is proportional to the voltage at the motor windings or leads. When drive circuit 602 powers motor 600, the driving voltage will determine this DC voltage at the bridge rectifier 610. However, when the drive circuit is disconnected, the voltage at the motor windings will be proportional to the motor speed due to back electromagnetic force of the motor 600. Comparator 612 is configured to allow current through electromechanical actuator if the DC value is above a quiesced threshold, which is a predetermined value that correlates to a speed at or above which (for example) the motor and the air-moving assembly should remain locked in place.

There are many potential implementations for the threshold concept, with a resistor R1 in-series with a solenoid coil 615 (of the actuator) being one example. In one or more implementations, the electromechanical actuator will be OFF if the DC voltage at the bridge rectifier 610 is below the quiesced threshold, or dropout voltage of the actuator. At higher values, the actuator resistance and resistance R1 will determine if the electromechanical actuator (for instance, solenoid coil) is energized or not. A Zener diode D1 may be provided as a clamp to ensure that solenoid coil 615 voltage does not become too high. Signal light 505 may be, for instance, in-series with solenoid coil 615, and if the coil is ON (meaning the movable element is in operational position (for example, a locked position)), then the signal light is lit. Thus, when signal light 505 is OFF, it is safe to remove the one or more components, such as the air-moving assembly, being protected by the electromechanical assembly.

Figure 7A:
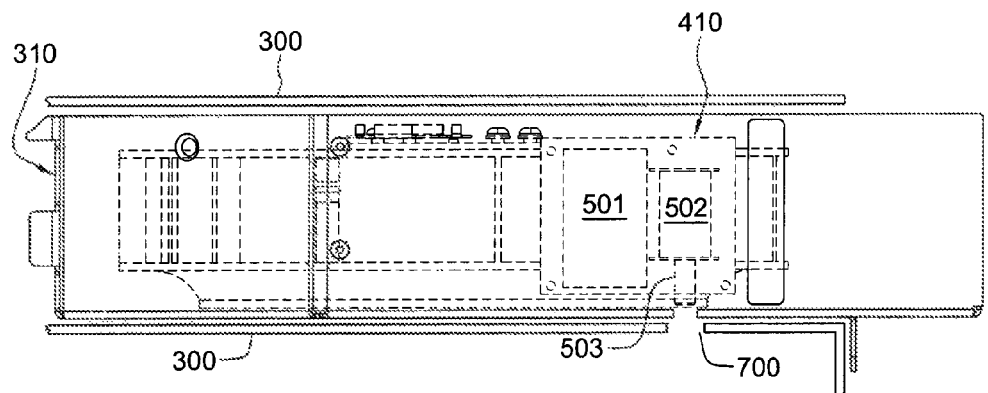
FIG. 7A is an elevational view of the apparatus of FIG. 4, shown with the air-moving assembly in operative position within a chassis, and an interlock element of the associated electromechanical assembly in quiesced position indicative of the air-moving assembly being in quiesced state, in accordance with one or more aspects of the present invention.
Figure 7B:
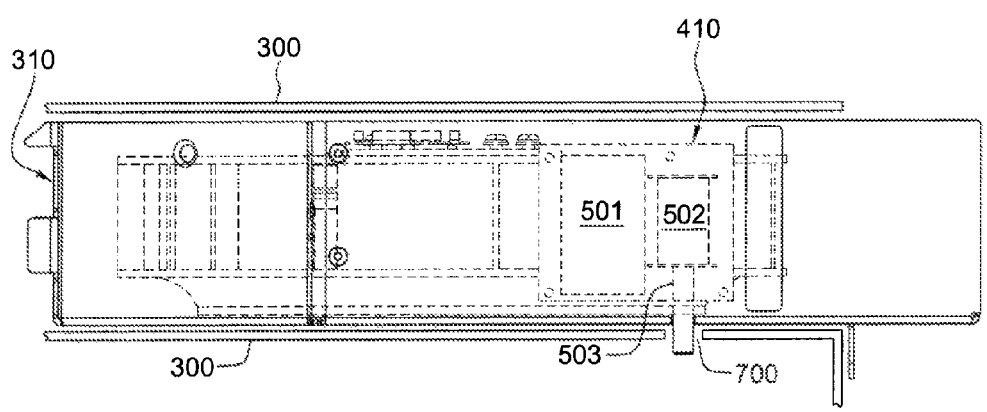
FIG. 7B depicts the apparatus of FIG. 7A, with the interlock element shown in operational position, interlocking with the chassis to prevent removal of the air-moving assembly from the chassis, in accordance with one or more aspects of the present invention.

FIGS. 7A & 7B depict one example of electromechanical assembly 410 of FIGS. 4-6 in operation. In FIG. 7A, the movable component 503 is in quiesced position, retracted into the housing of air-moving assembly 310, with the air-moving assembly 310 shown in operational position within chassis 300. In this view, power to air-moving assembly 310 is assumed to be off, and little or no back electromagnetic force is being generated at the motor windings of the air-moving assembly.

In FIG. 7B, the motor of the air-moving assembly may be operational, with a sensed voltage at one or more of the motor windings energizing the electromechanical actuator of electromechanical assembly 410 to extend (in this example) movable component 503 to the operational position. In the embodiment depicted, sufficient travel is provided to allow movable component 503 to extend through an aligned, interlock opening 700 in chassis 300 configured to facilitate the interlock function described herein. In this position, movable component 503 is an interlock element which locks the air-moving assembly 310 housing in place within chassis 300, and thereby prevents removal of the air-moving assembly from the chassis while sensed voltage at the one or more motor windings is at or above the predefined, quiesced threshold level.

Implementation of the electromechanical assembly described above in connection with FIGS. 4-7B can vary, including for instance, in terms of placement of the electromechanical assembly, as well as configuration of the assembly.

Figure 8:
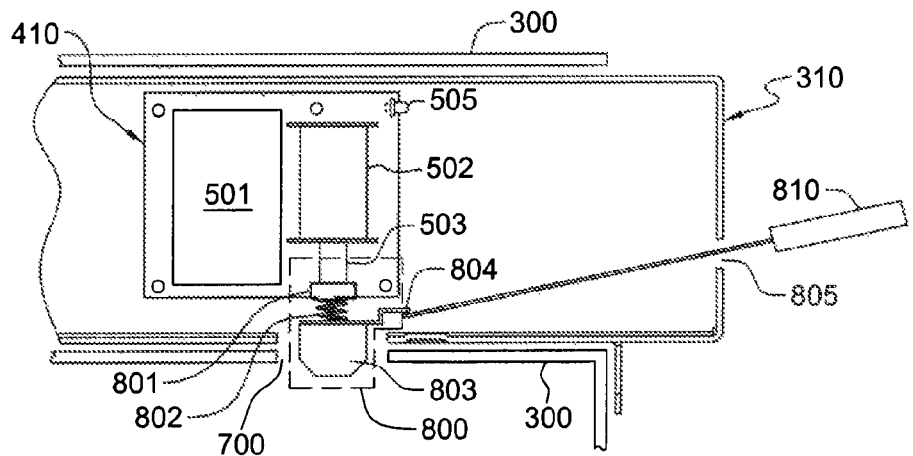
FIG. 8 depicts an alternate embodiment of a movable element of an electromechanical assembly interlocked to a support structure, in accordance with one or more aspects of the present invention.

FIG. 8 depicts one alternate configuration of electromechanical assembly 410, wherein a movable element 800 is provided which includes movable component 503 described above, as well as a base 801, a spring mechanism 802, and an interlock tab or plunger 803. In the operational position illustrated, movable element 800, and in particular, interlock tab 803 extends through opening 700 in chassis 300 to interlock one or more components associated with the electromechanical assembly 410 to chassis 300 to prevent removal of the one or more components, with the air-moving assembly being one example of one component which may be interlocked to the chassis using the assembly described herein. In this configuration, spring mechanism 802 advantageously facilitates partial decoupling interlock tab 803 from mechanical actuator 502. Should an operator attempt removal of the component(s) locked by the electromechanical assembly, then spring mechanism 802 provides a degree of movement while still ensuring interlocking of the assembly to the chassis. In the embodiment depicted, an extension feature 804 is provided in association with, for instance, interlocking tab 803 to allow mechanical override of electromechanical assembly 410 should, for instance, the assembly fault with movable element 800 in the operational position, notwithstanding, for example, that the associated motor being monitored is quiesced. In the depicted embodiment, an opening 805 may be provided in chassis 300 to allows for insertion of an override tool 810 to engage extension feature 804 and allow, for instance, manual movement of interlocking tab 803 from opening 700 to allow (for instance) for removal of the associated one or more components.

Figure 9A:
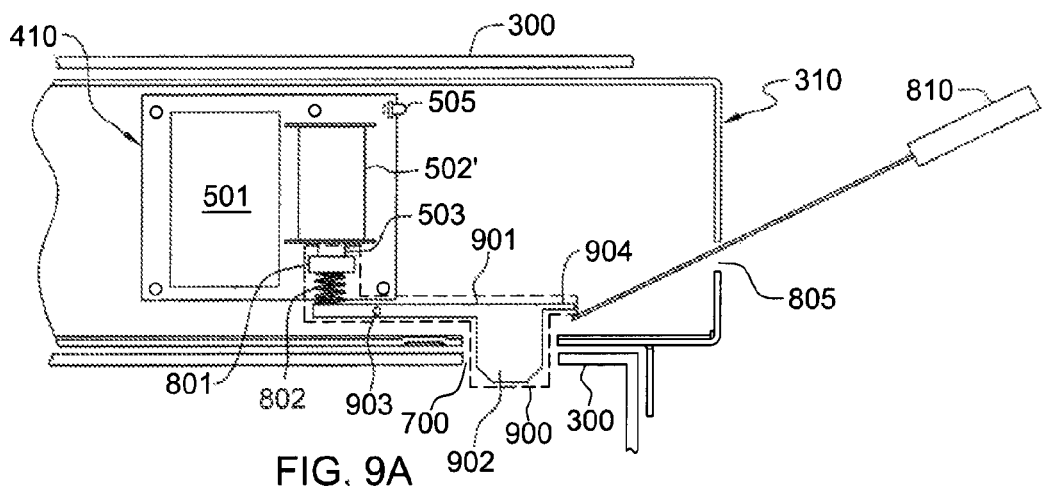
FIG. 9A depicts another embodiment of a moveable element of an electromechanical assembly with the movable element interlocked to a support structure, in accordance with one or more aspects of the present invention.
Figure 9B:
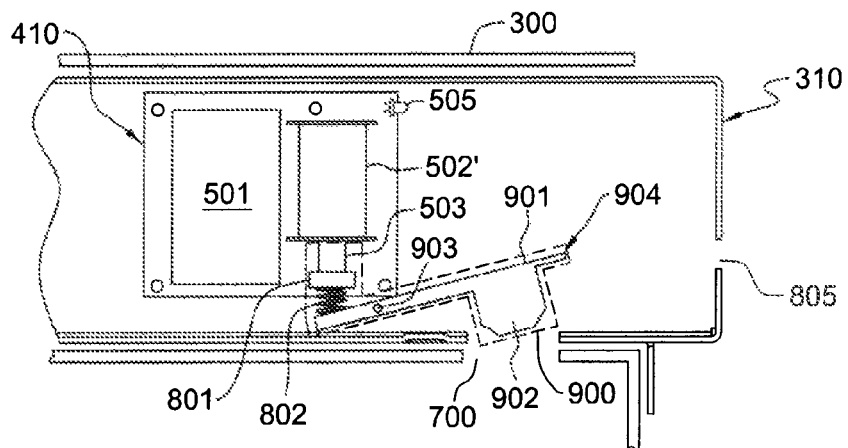
FIG. 9B depicts the apparatus of FIG. 9A, with the movable element of the electromechanical assembly shown in quiesced position, retracted from the support structure opening, in accordance with one or more aspects of the present invention.

FIGS. 9A & 9B depict another implementation of an electromechanical assembly, in accordance with one or more aspects of the present invention. In this configuration, a movable element 900 replaces movable element 800 of the embodiment of FIG. 8, and includes, for instance, moveable component 503, base 801, spring mechanism 802, and an L-shaped pivot arm 901 pivotably mounted 903 to a structure disposed within chassis 300 when in operational position, such as to the housing of air-moving assembly 310. In this particular implementation, the electromagnetic actuator 502' is alternately configured from the electromechanical actuator 502 described above in connection with FIGS. 4-8. In particular, in one or more implementations of electromechanical actuator 502', the actuator and component 503 are configured such that movable component 503 is retracted relative to the actuator when in operational position, and is extended relative to the actuator when in quiesced position. As noted, one of ordinary skill in the art could configure or select the actuator and/or control circuit such that movable component 503 is either extended or retracted when in the operational position, that is, is either a push-type actuator or a pull-type actuator, as desired for a particular implementation.

In FIG. 9A, the operational position is depicted, which in this configuration, means that the movable component 503 is retracted, allowing the end of L-shaped pivot arm 901 to be pulled up, and the interlocking tab 902 of L-shaped pivot arm 901 to extend through opening 700 in chassis 300, thereby interlocking the one or more components associated with the electromechanical assembly relative to the chassis.

In FIG. 9B, the motor being monitored is assumed quiesced, with the movable component 503 shown extended to compress spring mechanism 802 against L-shaped pivot arm 901, pivoting interlocking tab 902 upwards from opening 701, to allow for removal of, for instance, air-moving assembly 310 from chassis 300.

FIGS. 10A-10E depict a further implementation of an apparatus comprising an electromechanical assembly such as disclosed herein.

Figure 10A:
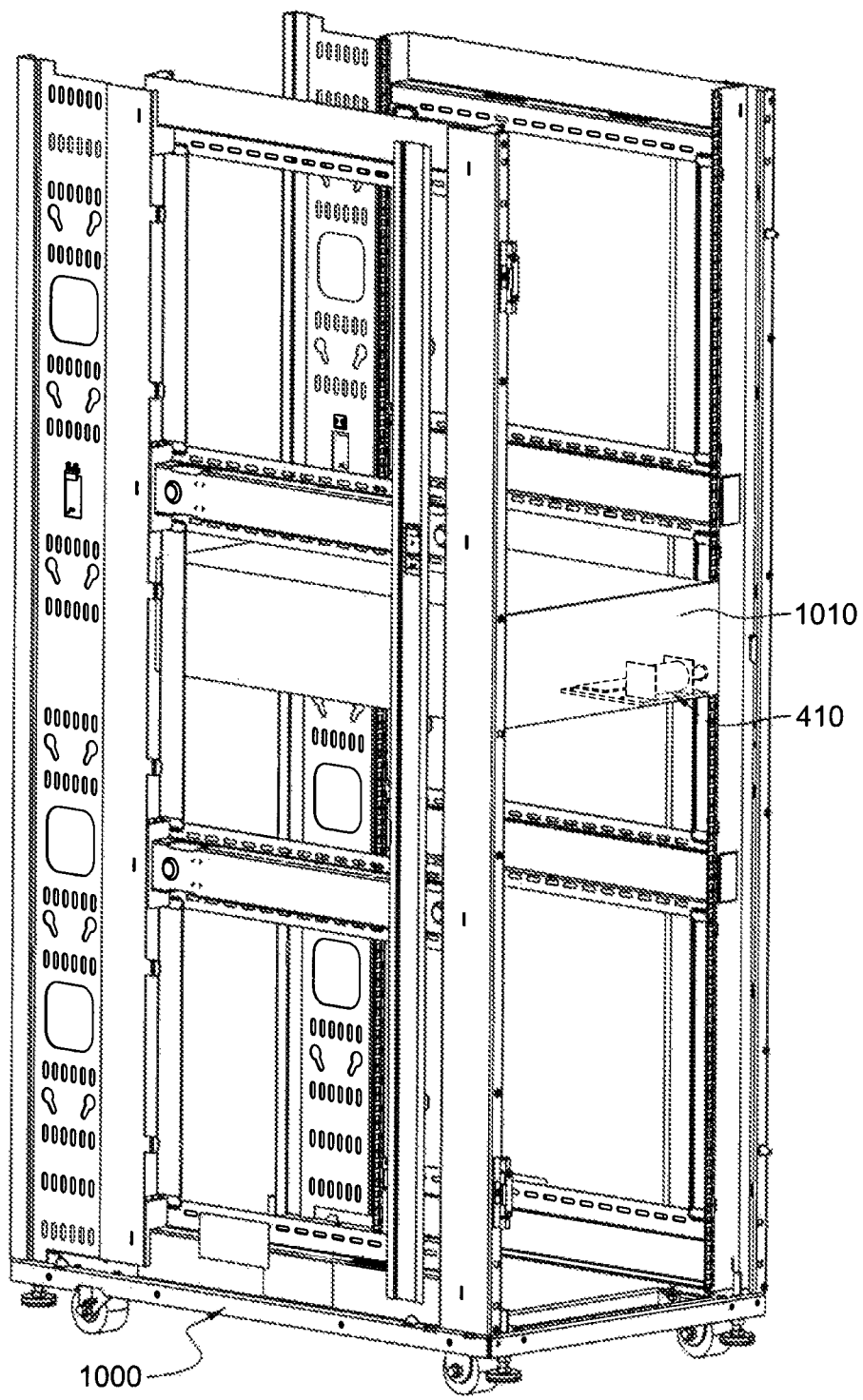
FIG. 10A depicts one embodiment of a partially assembled electronics rack, with an electronics drawer shown in operative position within the electronics rack, the electronics drawer including an electromechanical assembly, in accordance with one or more aspects of the present invention.
Figure 10B:
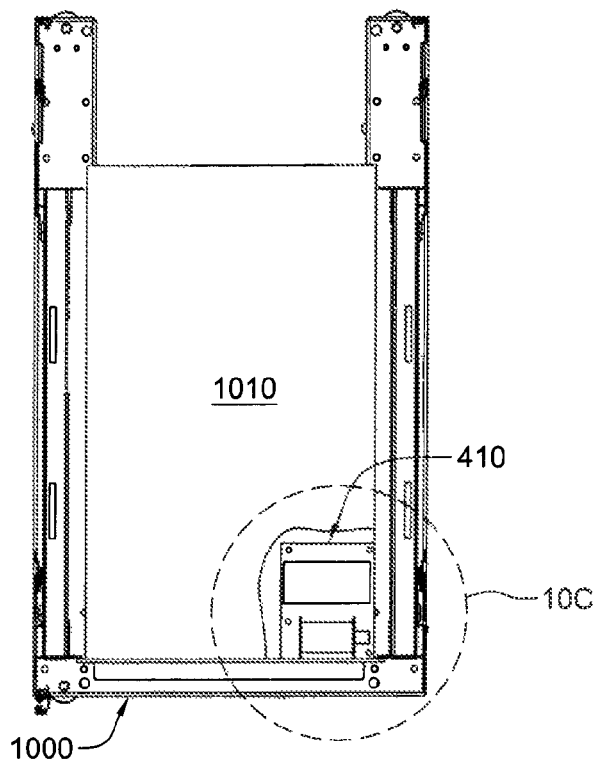
FIG. 10B is a partial cutaway, upper plan view of the electronics rack and drawer of FIG. 10A, depicting the electromechanical assembly to be similar to that shown in FIGS. 4-7B, in accordance with one or more aspects of the present invention.
Figure 10C:
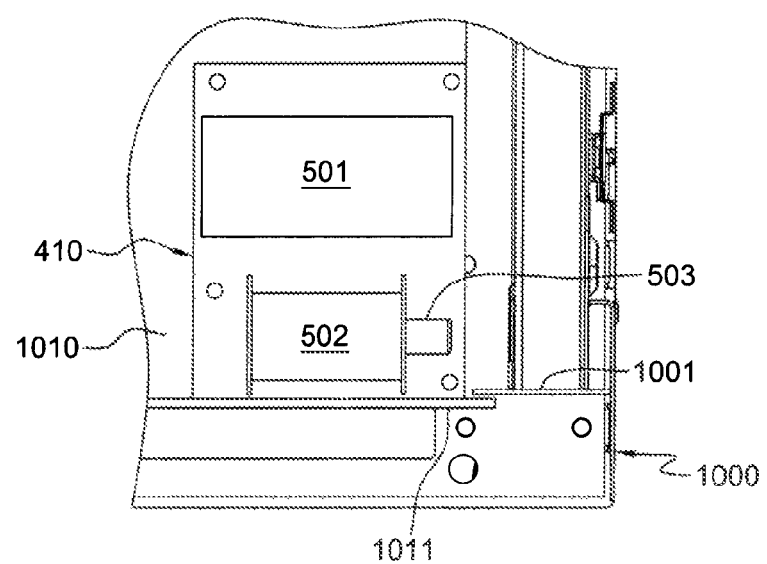
FIG. 10C is a partial enlargement of the electronics rack and drawer of FIG. 10B, with the interlock element of the electromechanical assembly shown in quiesced position, in accordance with one or more aspects of the present invention.

Referring collectively to FIGS. 10A-10C, the apparatus is shown to include, in one embodiment, an electronics rack 1000 (shown partially assembled) and one or more electronics drawers 1010. In one or more implementations, electronics rack 1000 may be similar to electronics rack 100 described above in connection with FIG. 1, with electronics drawer 1010 being one example of an electronics subsystem within an electronics rack 1000. Together, electronics rack 1000 and electronics drawer 1010 define a support structure for one or more components within, for instance, electronics drawer 1010. In the depicted implementation, one or more electromechanical assemblies 410 may be associated with, for instance, disposed within, electronics drawer 1010 to, for example, facilitate interlocking electronics drawer 1010 to electronics frame 1000 when sensed voltage at one or more motors associated with electronics drawer 1010 or sensed voltage within the electronics drawer is above a quiesced threshold. By way of example, the one or more motors may be associated with one or more air-moving assemblies, such as discussed herein. The air-moving assemblies may be located within electronics drawer 1010 or, alternatively, external to electronics drawer 1010, for instance, elsewhere within electronics rack 1000. One or more wires or conductive lines (not shown) may be provided to electrically couple electromechanical assembly 410 to the motor windings in order to sense voltage across the motor windings. As noted, sensed voltage within the electronics drawer or within an electronic system associated with the electronics drawer could alternatively be monitored by the electromechanical assembly to ensure that energy levels within the system or drawer are at a safe level before the electromechanical assembly allows removal of the electronics drawer from the rack.

As illustrated in FIGS. 10B & 10C, in one or more implementations, electromechanical assembly 410 is disposed at, for instance, a front corner of electronics drawer 1010 adjacent to, for instance, a face plate 1011 of the electronics drawer 1010, housing or chassis. As illustrated in FIG. 10C, face plate 1011 contacts a stop plate 1001 of electronics rack 1000 when electronics drawer 1010 is operatively positioned within electronics rack 1000. In FIGS. 10B & 10C, movable element or component 503 is shown in quiesced position which, in the above-described implementation of electromechanical assembly 410 of FIGS. 4-7B, is a retracted position. In this quiesced position, the associated motor windings being monitored are assumed to have zero voltage or the voltage level which corresponds to a level below the defined quiesced threshold level. When the motor is operating or back electromotive force being generated is greater than the quiesced threshold of electromechanical assembly 410, movable element or component 503 is in an operational position, which as noted, in the electromechanical assembly 410 depicted is in an extended position, as illustrated in FIG. 10D.

Figure 10D:
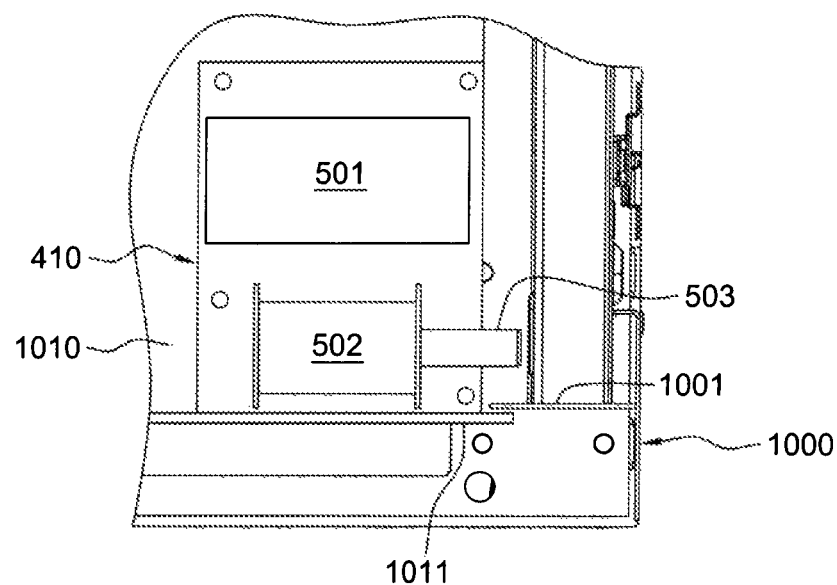
FIG. 10D depicts the enlarged view of FIG. 10C, with the interlock element shown in operational position, in accordance with one or more aspects of the present invention.
Figure 10E:
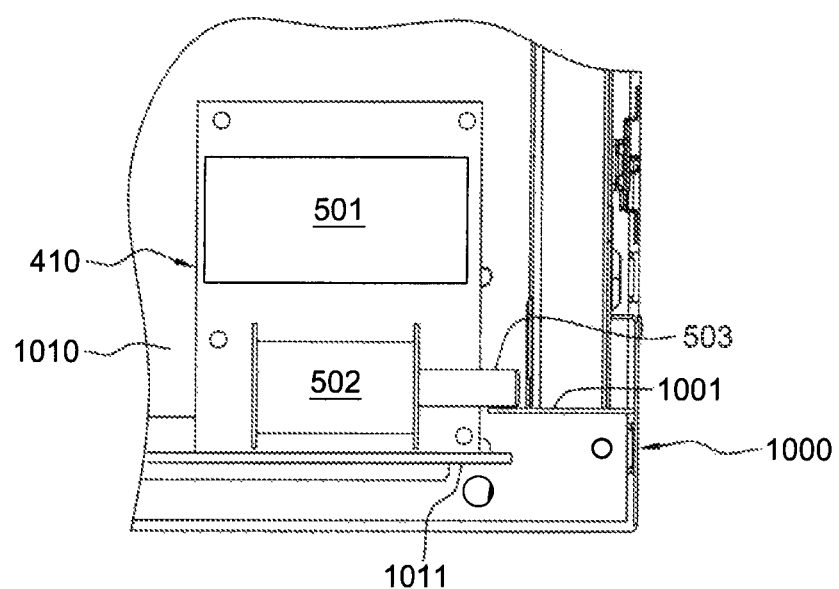
FIG. 10E depicts the assembly of FIG. 10D, with the interlock element in operational position shown contacting a portion of the electronics rack and preventing removal of the electronics drawer from the electronics rack, in accordance with one or more aspects of the present invention.

In one or more implementations, movable element or component 503 is configured with a sufficient length, and electromechanical assembly 410 is positioned within electronics drawer 1010 so as to allow movable component 503 to project through an aligned opening in the housing or chassis of electronics drawer 1010, as illustrated in FIG. 10D. As shown in FIG. 10E, in the particular implementation depicted, movable component 503 is sized and positioned to contact in operational position with stop plate 1001 of electronics rack 1000. Thus, one or more electromechanical assemblies 410 may be provided within one or more electronic subsystems, such as one or more electronics drawers 1010 of electronics rack 1000, to interlock the subsystem or drawer within the electronics rack while motor winding voltage being monitored is at a voltage level above the quiesced threshold defined to be a safe threshold below which the associated electronics subsystem, system, drawer, etc., may be removed.

Figure 11A:
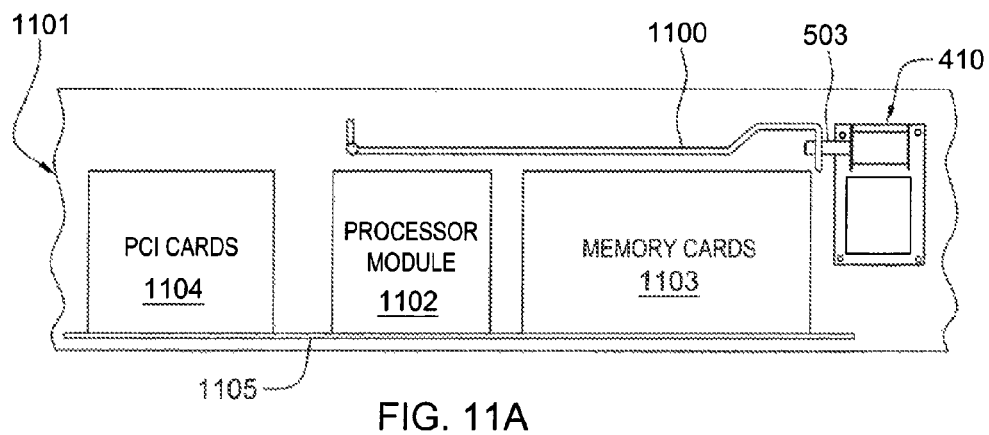
FIG. 11A depicts another partial embodiment of an electronics drawer with a cover and an electromechanical assembly similar, for instance, to that depicted in FIGS. 4-7B, locking the cover in position over one or more components of the electronics drawer when the movable element of the assembly is in operational position, in accordance with one or more aspects of the present invention.
Figure 11B:
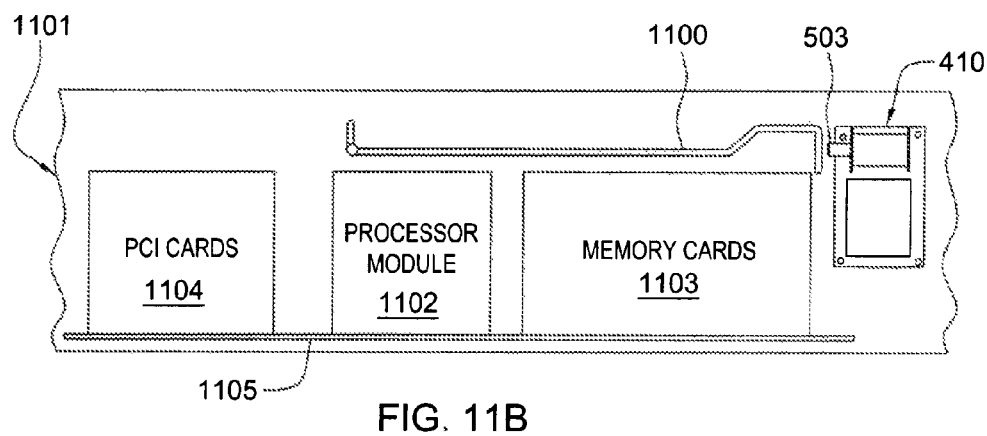
FIG. 11B depicts the electronics drawer of FIG. 11A, with the movable element of the electromechanical assembly shown in quiesced position, allowing for opening of the cover and thus access to the one or more components of the electronics drawer beneath the cover, in accordance with one or more aspects of the present invention.

As noted, the electromechanical assembly disclosed herein could be applied in a number of ways to restrict access to one or more components. FIGS. 11A & 11B depict a further variation.

In FIG. 11A, an electronic system 1101 is partially illustrated, which includes and electronics board or substrate 1105 supporting a plurality of components of the electronic system. By way of example, the components may include one or more processor modules 1102, one or more memory cards 1103, and one or more PCI cards 1104, as well as other components. In this configuration, a hinged cover 1100 is provided over one or more of the components within electronic system 1101. For instance, hinged cover 1100 may be provided over the one or more processor modules 1102 and the one or more memory cards 1103. With such a configuration, it may be possible to service a portion of the components within electronic system 1101 when the cover is closed, such as, for instance, PCI cards 1104, while other components of the electronic system, such as the processor modules and memory cards, are not serviceable or accessible. Hinged cover 1100 may thus function as a safety cover, and an electromechanical assembly 410 (such as described herein) may be employed to latch or lock cover 1100 in position as illustrated in FIG. 11A, when a sensed voltage within or associated with the electronic system 1101 is above a quiesced threshold.

More particularly, with a configuration of electromechanical assembly 410 such as described above in connection with FIGS. 4-7B, movable element or component 503 in operational position is extended, and electromechanical assembly 410 may be located so that movable component 503 extends into an appropriately configured receiving opening (not shown) in cover 1100 to interlock with the cover and prevent opening of cover 100 while the movable element remains in the operational position.

As illustrated in FIG. 11B, once the sensed voltage falls below a quiesced threshold for safe removal of one or more components beneath the cover, then the moveable component 503 is transitioned by electromechanical assembly 410 to the quiesced position, which in one embodiment, is the retracted position, where the movable element is withdrawn from interlocking with cover 1100, thus allowing for opening of the cover and access to the one or more components beneath the cover.

Note that the above-described implementation of FIGS. 11A & 11B advantageously may be employed to prevent access to one or more components where the energy level of the components or system may be above a level that a person could safely contact, defined, for instance, by UL safety limits. With this approach, the hinged cover is locked safely in place until, for instance, the system energy level is bled down to a safe level, as represented by the monitored system voltage being below the quiesced threshold. Note that in one or more implementations, energy within the system could be monitored or sensed at one or more points in the system, such as, for example, at one or more capacitors or other components.

Figure 12A:
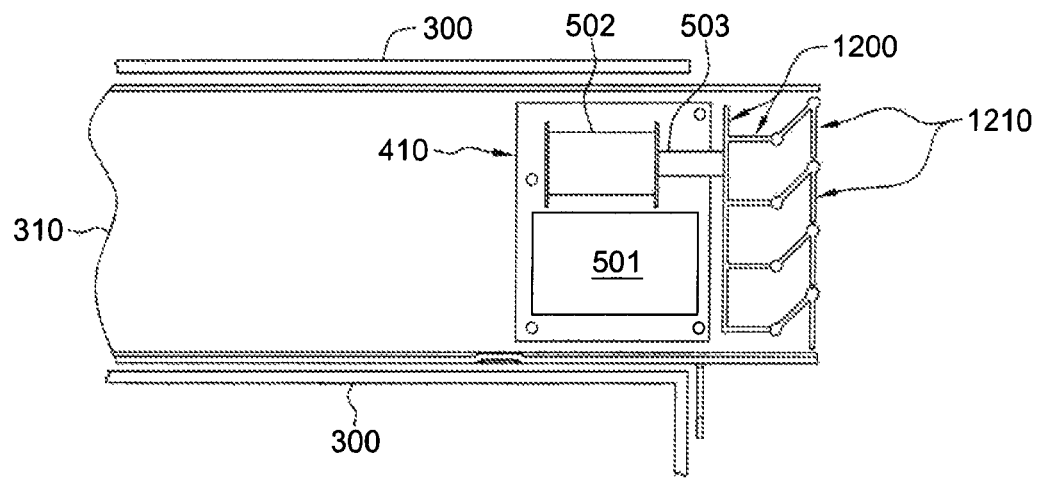
FIG. 12A is a further embodiment of an electromechanical assembly, wherein the electromechanical assembly mechanically couples to one or more louvers disposed at, for instance, the air inlet side or air outlet side of an air-moving assembly, to direct actuation of the louvers based on sensed voltage at one or more motor windings of the air-moving assembly, in accordance with one or more aspects of the present invention.
Figure 12B:
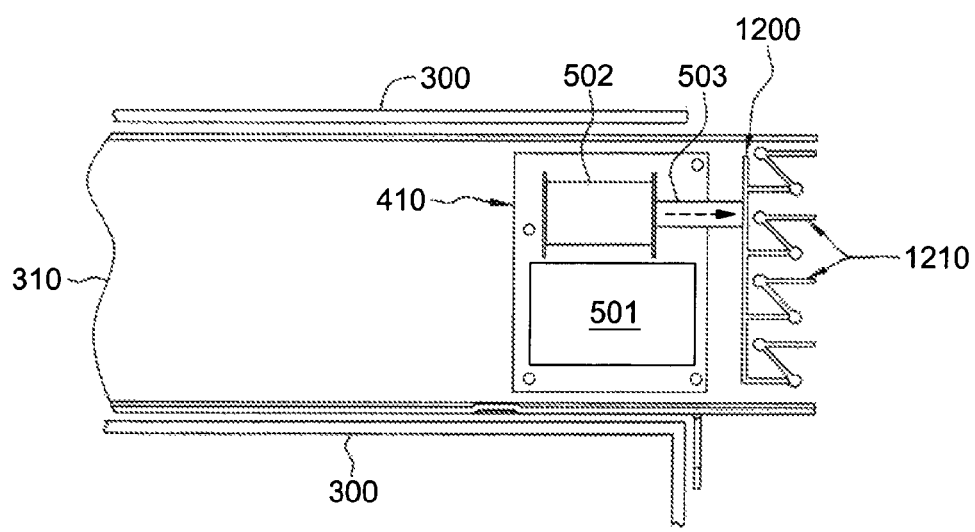
FIG. 12B depicts the apparatus of FIG. 12A, with the movable element of the assembly shown in operational position, forcing open the one or more louvers to facilitate airflow through the air-moving assembly, in accordance with one or more aspects of the present invention.

FIGS. 12A-12B depict one alternative use for an electromechanical assembly such as disclosed herein. In these figures, electromechanical assembly 410 is assumed to be associated with air-moving assembly 310, with air-moving assembly 310 shown in operative position within chassis 300. As shown, electromechanical assembly 410 couples via a coupling linkage 1200 to one or more louvers 1210 disposed at the air inlet side or air outlet side of air-moving assembly 310. Coupling linkage 1200 movably couples movable component 503 to louvers 1210, such that in the quiesced position illustrated in FIG. 12A, electromechanical assembly 410 directly closes louver(s) 1210 to, for instance, prevent recirculation of air through air-moving assembly 310. When, for instance, the air-moving assembly 310 is operational, or the sensed voltage at the fan's motor is above the quiesced threshold, then the movable component 503 is in operational position, which opens the louvers to facilitate airflow through the assembly.

Figure 13A:
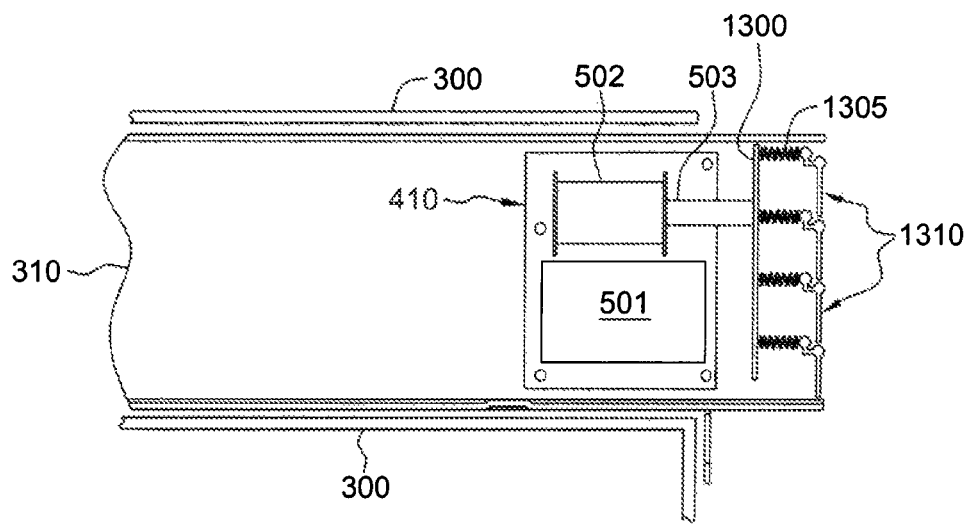
FIG. 13A illustrates a further embodiment of an electromechanical assembly, wherein the movable element of the electromechanical assembly is shown in operational position, not loading one or more springs coupling the assembly to one or more louvers, with the louvers shown in a quiesced, closed orientation, in accordance with one or more aspects of the present invention.
Figure 13B:
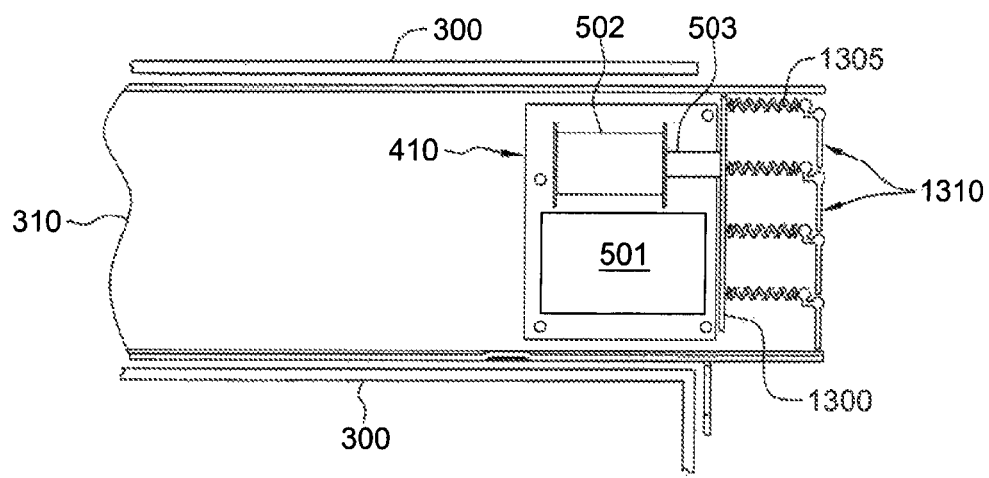
FIG. 13B depicts the assembly of FIG. 13A, with the movable element in quiesced position, shown loading the springs to apply a bias to the one or more louvers to reduce the airflow force required to subsequently open the louvers, in accordance with one or more aspects of the present invention.

FIGS. 13A & 13B depict a further variation, wherein electromechanical assembly 410 is coupled to provide weight compensation to one or more louvers 1310 at the air inlet or air outlet of air-moving assembly 310. In the embodiment depicted in FIGS. 13A & 13B, air-moving assembly 310 is shown in operational position within chassis 300. In this configuration, the louver(s) 1310 is shown uncompensated in FIG. 13A, and weight-compensated in FIG. 13B, using a coupling 1300 connected to movable component 503 of electromechanical assembly 410 which includes spring-biasing 1305. In FIG. 13A, element 305 is shown extended, and the spring-biasing 1305 is in relaxed, un-extended state.

In FIG. 13B, the electromechanical assembly 410 has transitioned movable component 503 to the quiesced position, applying a load to spring-biasing 1305 to, for instance, reduce the airflow force required to open the one or more louvers 1310.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    providing an electromechanical assembly to couple to a system comprising at least one of a motor or an electronic system to monitor voltage at the motor or within the electronic system, the providing of the electromechanical assembly comprising:
        providing a control circuit to sense voltage at the motor or within the electronic system;
        providing an electromechanical actuator energized by the voltage sensed by the control circuit at the motor or within the electronic system; and
        providing a movable element associated with and movable by the electromechanical actuator, the electromechanical actuator moving the movable element from an operational position physically interlocking one or more components of the system or electronic system to a quiesced position not physically interlocking the one or more components when the voltage sensed by the control circuit at the motor or within the electronic system falls below a quiesced threshold, the one or more components comprising an air-moving assembly.

2. The method of claim 1, wherein the electromechanical assembly is coupled to monitor the voltage at the motor, the motor being part of the air-moving assembly, and the sensed voltage being sensed voltage at one or more motor windings of the motor, and where subsequent to a switching off of the air-moving assembly, the voltage at the one or more motor windings being sensed results from back electromotive force being generated by continued rotation of a rotor of the air-moving assembly.

3. The method of claim 2, wherein the air-moving assembly resides within a support structure of the system or electronic system in operative position, and wherein the movable element comprises an interlock element which interlocks to the support structure when in the operational position, to prevent removal of the one or more components from the support structure, and moves to the quiesced position when the sensed voltage at the one or more motor windings falls below the quiesced threshold, to allow removal of the one or more components from the support structure.

4. The method of claim 3, wherein the support structure comprises a chassis within which the air-moving assembly resides in operation, and wherein the interlock element preventing removal of the air-moving assembly from the chassis when the sensed voltage at the one or more motor windings is above the quiesced threshold.

5. The method of claim 3, wherein the system comprises an electronics drawer and an electronics rack, and the interlock element is associated with the electronics drawer and interlocks with the electronics rack to prevent removal of the electronics drawer from the electronics rack when the sensed voltage at the motor or within the electronic system is above the quiesced threshold.

6. The method of claim 3, wherein the control circuit comprises a bridge rectifier electrically coupled to the one or more motor windings, and a comparator for comparing the sensed voltage to the quiesced threshold, the quiesced threshold being predetermined as a safe threshold to allow for removal of the one or more components.

7. A method comprising:
    providing an electromechanical assembly to couple to a system comprising at least one of a motor or an electronic system to monitor voltage at the motor or within the electronic system, the providing of the electromechanical assembly comprising:
        providing a control circuit to sense voltage at the motor or within the electronic system;
        providing an electromechanical actuator energized by the voltage sensed by the control circuit at the motor or within the electronic system; and
        providing a movable element associated with and movable by the electromechanical actuator, the electromechanical actuator moving the movable element from an operational position physically interlocking one or more components of the system or electronic system to a quiesced position not physically interlocking the one or more components when the voltage sensed by the control circuit at the motor or within the electronic system falls below a quiesced threshold; and
    wherein the movable element comprises an interlock element which interlocks with a cover of an electronics drawer with which the system is associated, the interlock element preventing opening of the cover when the sensed voltage at the motor or within the electronic system is above the quiesced threshold, the one or more components comprising the cover of the electronics drawer.

8. The method of claim 1, wherein the movable element comprises, at least in part, a movable member of the electromechanical actuator, and wherein the electromechanical actuator further comprises a solenoid surrounding, at least in part, the movable member.

9. The method of claim 1, wherein the movable element comprises, at least in part, a spring mechanism coupled to the electromechanical actuator.

10. A method comprising:
    providing an electromechanical assembly to couple to a system comprising at least one of a motor or an electronic system to monitor voltage at the motor or within the electronic system, the providing of the electromechanical assembly comprising:
        providing a control circuit to sense voltage at the motor or within the electronic system;
        providing an electromechanical actuator energized by the voltage sensed by the control circuit at the motor or within the electronic system; and
        providing a movable element associated with and movable by the electromechanical actuator, the electromechanical actuator moving the movable element from an operational position physically interlocking one or more components of the system or electronic system to a quiesced position not physically interlocking the one or more components when the voltage sensed by the control circuit at the motor or within the electronic system falls below a quiesced threshold; and wherein the electromechanical assembly is coupled to monitor voltage at the motor, the motor being part of an air-moving assembly, and the sensed voltage being sensed voltage at one or more motor windings of the assembly, and the movable element couples to at least one louver disposed at one of an air inlet or an air outlet of the air-moving assembly, the movable element facilitating pivoting of the at least one louver between an operational orientation and a quiesced orientation based on the sensed voltage at the one or more motor windings.

* * * * *